United States Patent
Kever et al.

(10) Patent No.: US 7,055,114 B2
(45) Date of Patent: May 30, 2006

(54) SYSTEMS AND PROCESSES FOR ASYMMETRICALLY SHRINKING A VLSI LAYOUT

(75) Inventors: Wayne Dervon Kever, Fort Collins, CO (US); Kenneth Koch, II, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 238 days.

(21) Appl. No.: 10/681,815

(22) Filed: Oct. 8, 2003

(65) Prior Publication Data

US 2005/0081167 A1    Apr. 14, 2005

(51) Int. Cl.
*G06F 17/50* (2006.01)
(52) U.S. Cl. .......................... 716/2; 716/11
(58) Field of Classification Search ............ 716/2, 716/11
See application file for complete search history.

(56) References Cited

U.S. PATENT DOCUMENTS

| | | | | |
|---|---|---|---|---|
| 5,612,893 A | * | 3/1997 | Hao et al. | 716/2 |
| 5,936,868 A | * | 8/1999 | Hall | 716/4 |
| 6,699,627 B1 | * | 3/2004 | Smith et al. | 430/22 |
| 6,756,242 B1 | * | 6/2004 | Regan | 438/14 |

* cited by examiner

*Primary Examiner*—Sun James Lin

(57) ABSTRACT

Processes, software and systems asymmetrically shrink a layout for a VLSI circuit design. A first VLSI circuit design layout, defined by a first fabrication process with first design rules, is asymmetrically scaled to a second VLSI circuit design layout defined by a second fabrication process with second design rules. Layouts of one or more leaf cells of the second VLSI circuit design layout are processed to ensure conformity to the second design rules.

18 Claims, 10 Drawing Sheets

SYSTEMS AND PROCESSES FOR ASYMMETRICALLY SHRINKING A VLSI LAYOUT

BACKGROUND

An electronic computer aided design ("E-CAD") package is utilized to construct a Very Large Scale Integration ("VLSI") circuit design. Generally, the VLSI circuit design is the full electronic description of an electronic part (e.g., an integrated circuit). The VLSI circuit design is typically divided into functional areas, each known as a functional unit block ("FUB"). Each FUB is constructed from one or more hierarchical design blocks ('cells') that provide specific functionality to the FUB. Cells may be constructed from electronic design elements (e.g., nets, resistors, transistors, etc.) and other cells, and may be used one or more times within the VLSI circuit design. A cell that includes components (and not merely other cells) is known as a 'leaf' cell.

The VLSI circuit design includes a layout that defines physical layers of the integrated circuit constructed using a fabrication process with defined parameters and rules. Generally, this VLSI circuit design layout means the artwork, mask or physical representation of the electronic part; and the fabrication process means the process by which the electronic part is manufactured. In one example, the fabrication process defines a minimum track width and minimum transistor size. Typically, the fabrication process utilizes a grid with a predefined pitch upon which the layout is constructed.

The layout of a VLSI circuit design is an engineering-intensive process. By way of example, a multitude of design engineers typically collaborate on a VLSI circuit design that includes one poly-silicon layer (poly layer), for components (transistors, capacitors, etc.), and one or more metal layers (metal 1, metal 2, metal 3, etc.), which provide electrical connectivity to the components.

Improvements in the fabrication process result in decreased pitch, thereby increasing density of components of the poly layer. It is therefore often desirable to utilize any available improvements in the fabrication process. To take advantage of the improvements, design engineers often incorporate a 'shrink' process to reduce the layout by a proportional amount. However, a layout generated with a shrink process does not incorporate additional design rules (e.g., constraints) introduced by the new fabrication process. Accordingly, the shrunk layout is initially unusable and the circuit design layout is usually re-engineered to ensure conformity to the design rules and constraints of the new fabrication process. Often the entire layout is re-engineered to achieve conformity to the design rules.

Generally, therefore, the term "shrink" means the engineering effort of reducing one VLSI design to another, smaller VLSI design that is based upon a fabrication process with design rules that allow a more dense VLSI circuit design layout. The afore-mentioned design rules generally mean the rules embodied by the VLSI circuit design layout so that the electronic part may be manufactured by the fabrication process. An exemplary design rule is that transistors cannot be rotated. An exemplary constraint is that a net cannot incorporate forty-five degree angles.

If the VLSI circuit design has billions of design elements, re-engineering associated with a shrink process can take many man-months to complete. Opportunities to utilize improved fabrication processes are therefore often ignored due to development costs.

SUMMARY OF THE INVENTION

In one embodiment, a process asymmetrically shrinks a layout for a VLSI circuit design. A first VLSI circuit design layout, defined by a first fabrication process with first design rules, is asymmetrically scaled to a second VLSI circuit design layout, defined by a second fabrication process with second design rules. Layouts of one or more leaf cells of the second VLSI circuit design layout are processed to ensure conformity to the second design rules.

In another embodiment, a software product has instructions, stored on computer-readable media, wherein the instructions, when executed by a computer, perform steps for asymmetrically shrinking a layout for a VLSI circuit design, including:

instructions for asymmetrically scaling a first VLSI circuit design layout, defined by a first fabrication process having first design rules, to a second VLSI circuit design layout, defined by a second fabrication process having second design rules; and instructions for processing layouts of one or more leaf cells of the second VLSI circuit design layout to ensure conformity to the second design rules.

In one embodiment, a system asymmetrically shrinks a layout for a VLSI circuit design, including: means for asymmetrically scaling a first VLSI circuit design layout, defined by a first fabrication process having first design rules, to a second VLSI circuit design layout, defined by a second fabrication process having second design rules; and means for processing layouts of one or more leaf cells of the second VLSI circuit design layout to ensure conformity to the second design rules.

DETAILED DESCRIPTION OF THE FIGURES

Figure 1:
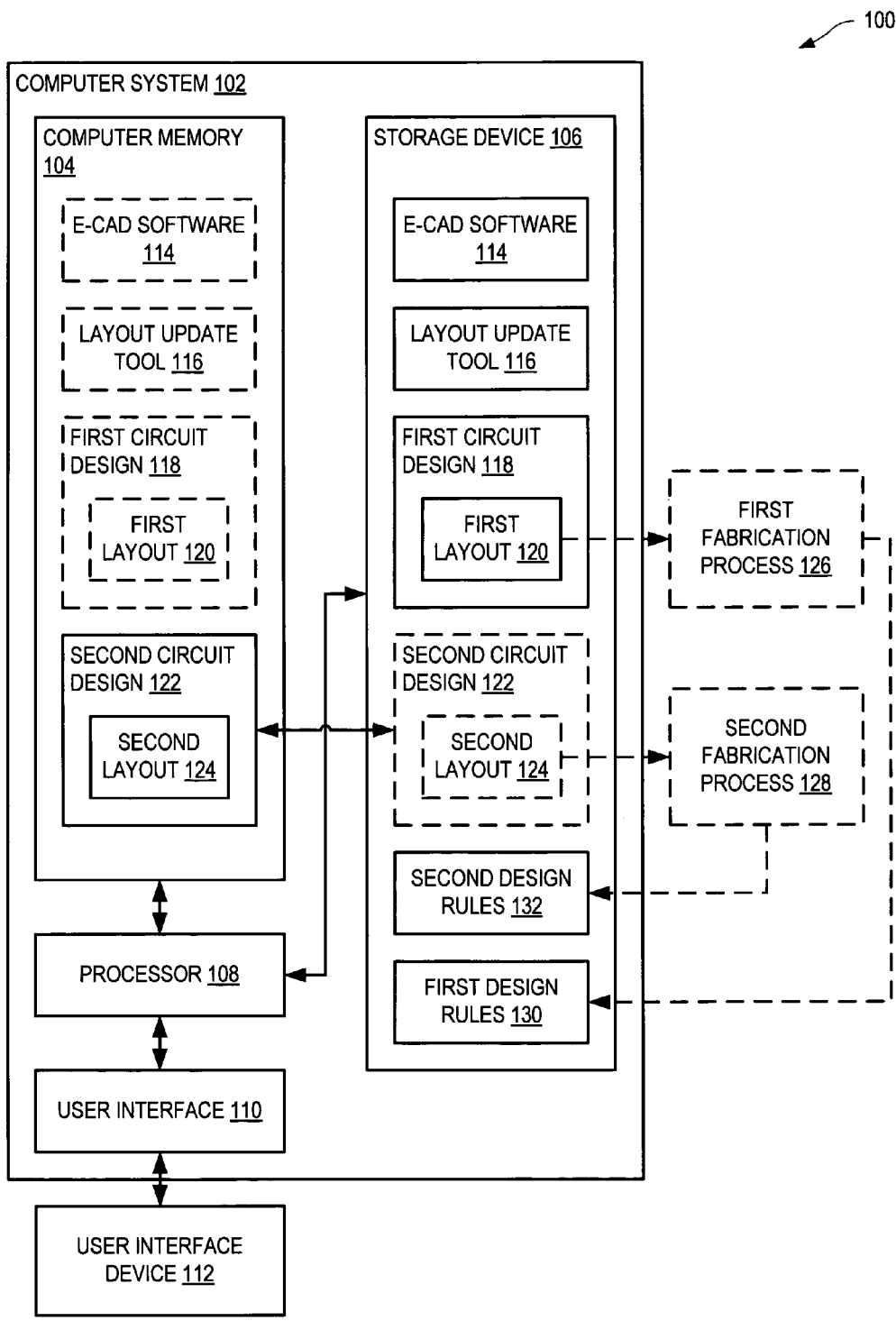
FIG. 1 shows one system for asymmetrically shrinking a VLSI circuit design layout.

FIG. 1 illustrates one system 100 for asymmetrically shrinking a very large scale integration ("VLSI") circuit design layout. System 100 includes a computer system 102 and a user interface device 112. In this example, computer system 102 includes computer memory 104, a storage device 106, a processor 108 and a user interface 110. Storage device 106 is shown with electronic computer aided design ("E-CAD") software 114, a layout update tool 116, and a first circuit design 118. First circuit design 118 includes a first layout 120 developed according to a first fabrication process 126, described below. Computer memory 104 is shown with a second circuit design 122, which includes a second layout 124 developed according to a second fabrication process 128, described below.

In one embodiment, processor 108 loads E-CAD software 114, layout update tool 116 and at least part of first circuit design 118 into computer memory 104 (as shown by dashed lines of items 114, 116, 118 in computer memory 104) to facilitate optional modification of circuit design 118 and to generate second circuit design 122. For example, processor 108 executes layout update tool 116 to interact with one or more design engineers to asymmetrically scale first layout 120 of circuit design 118 to second layout 124 of second circuit design 122. Second circuit design 122, including second layout 124, is optionally written to storage device 106 by processor 108 (as shown by dashed lines of items 122, 124 in storage device 106).

First fabrication process 126 utilizes layout design rules, illustrated as first design rules 130 in storage device 106. Second fabrication process 128 also utilizes layout design rules, illustrated as second design rules 132 in storage device 106. Second fabrication process 128 is improved over first fabrication process 126, and second design rules 132 may include additional constraints and design rules (as compared to first design rules 130) associated with second fabrication process 128. Through user interface device 112 and user interface 110, one or more design engineers interact with E-CAD software 114 and layout update tool 116 to develop second circuit design 122, which is based on (asymmetrically scaled to) first circuit design 118 but which incorporates second design rules 132 (not first design rules 130). User interface device 112 is, for example, a workstation.

The scaling of first layout 120 to generate second layout 124 is asymmetrical; x and y-dimensions (e.g., see FIGS. 5-10, 13) of first circuit design 118 are therefore scaled differently to optimize first layout 120 with second fabrication process 128. For example, if second fabrication process 128 introduces an additional design rule (e.g., in second design rules 132) that prohibits transistor rotation, the scaling factor for the x-dimension may increase in order to fit un-rotated transistors within second layout 124. The y-dimension scaling, however, remains at the optimal scaling factor (in this example), minimizing impact on performance and timing of signals traversing the y-dimension. For example, metal 3 and metal 5 layers of integrated circuit designs 118 and 122 are commonly used for timing and control signals traversing the y-dimension, as described below.

Figure 2:
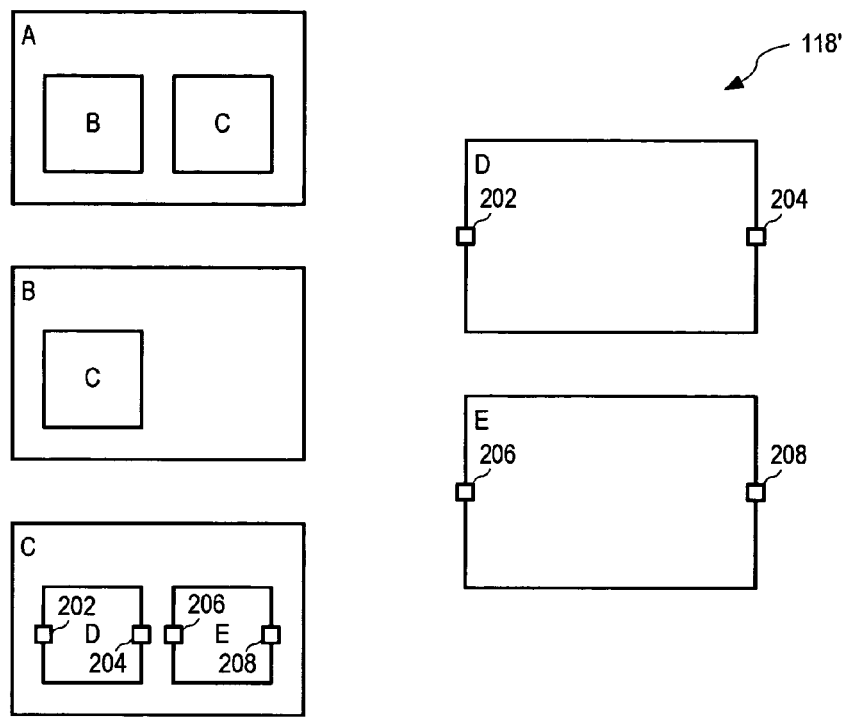
FIG. 2 illustrates exemplary cells in a hierarchical circuit design.

FIG. 2 is a block diagram illustrating cells within an exemplary hierarchical circuit design 118'. Cell A includes cells B and C. Cell B includes cell C. Cell C includes cells D and E. Cells D and E do not contain other cells. Design elements are not shown within cells A–E for clarity of illustration. In one example, a design engineer defines cells A–E prior to their instantiation within circuit design 118'. In this example, cells D and E are each shown with two ports, 202, 204 and 206, 208, respectively. Ports 202 and 204 represent connection points between circuitry within cell D to circuitry external of cell D. Similarly, ports 206 and 208 represent connection points between circuitry within cell E to circuitry outside of cell E.

Figure 3:
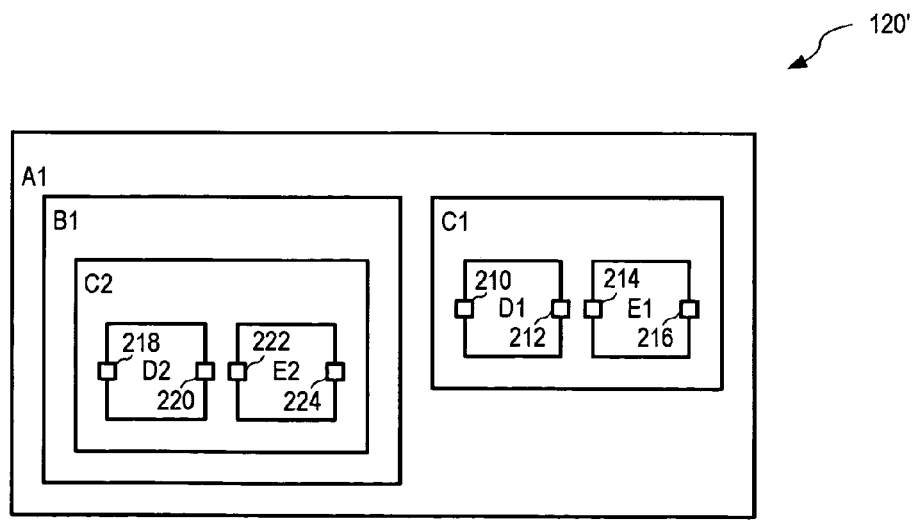
FIG. 3 illustrates exemplary cells of FIG. 2 instantiated in a hierarchical circuit design layout.

FIG. 3 is a block diagram illustrating exemplary instantiations of cells A–E of circuit design 118', FIG. 2, in a circuit design layout 120'. In circuit design layout 120', cell A is instantiated as instance A1, and is the highest hierarchical level of circuit design 118'. Instance A1 includes instantiations of cell B and cell C, shown as instance B1 and instance C1, respectively. Instance C1 includes instantiations of cells D and E, shown as instance D1 and instance E1. Cell B also includes cell C, resulting in a second instantiation of cell C and shown as instance C2. Instance C2 further instantiates instance D2 and instance E2, as shown. FIG. 3 further illustrates locations of ports 202, 204, 206 and 208 of cells D and E after instantiation of cells D and E as instances D1, D2, E1 and E2. Ports 202 and 204 of cell D are shown as port instances 210 and 212 within instance D1, and as port instances 218 and 220 within instance D2. Ports 206 and 208 of cell E are shown as port instances 214 and 216 within instance E1 and as port instances 222 and 224 within instance E2. Ports and port instances are shown only for cells D and E for clarity of illustration, and should not be construed as limiting. Cells D and E do not include other cells and therefore instances D1, D2, E1 and E2 may be considered instances of 'leaf' cells.

Figure 4:
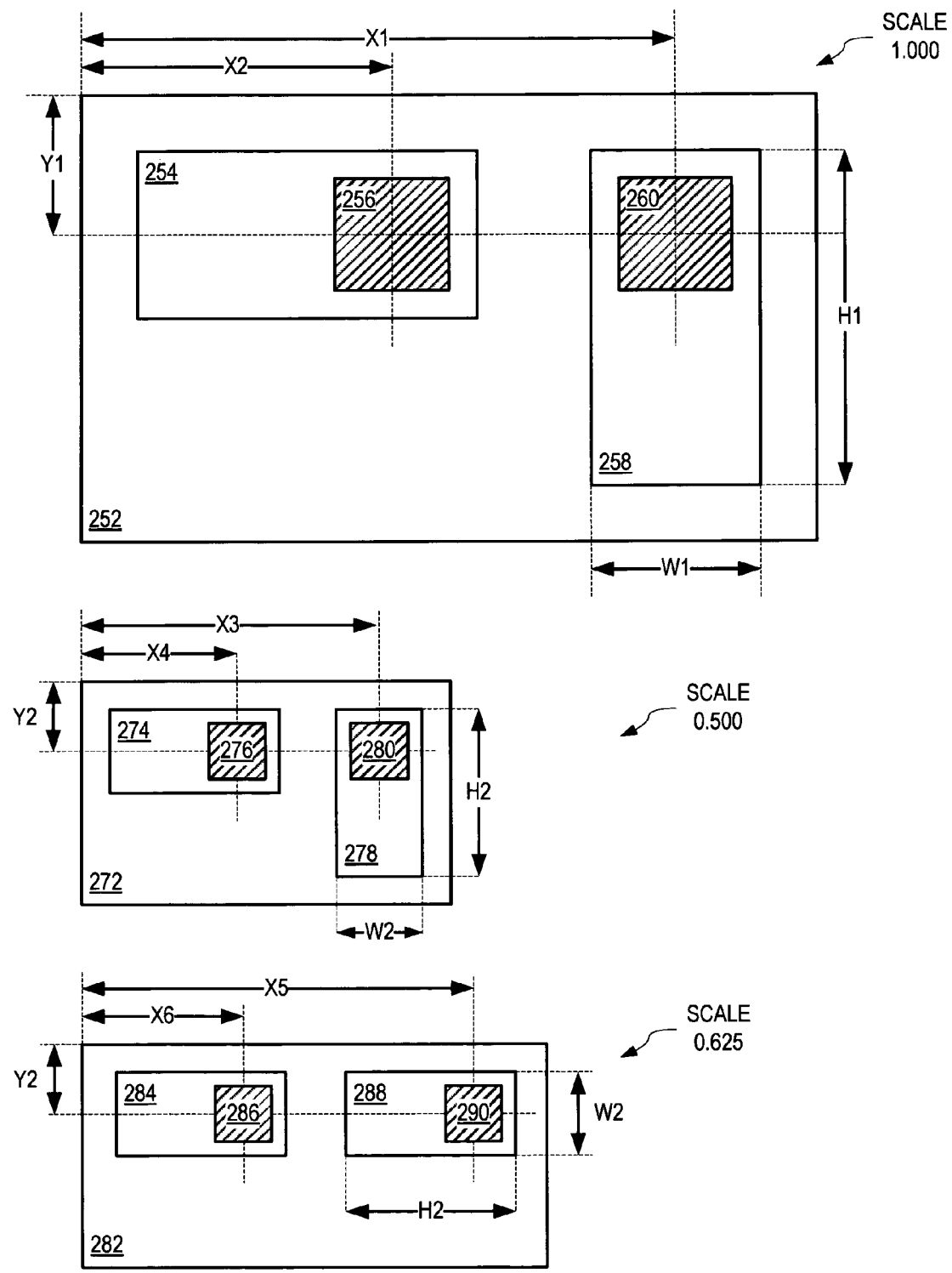
FIG. 4 illustrates symmetric and asymmetric scaling of one cell containing two design elements and two port instances.

FIG. 4 illustrates one cell layout 252 containing two design elements 254 and 258 and two port instances 256 and 260, prior to asymmetric scaling as disclosed herein. Design element 254 is a transistor, for example, and is shown connected to port instance 256. Design element 258 is also a transistor, for example, that is rotated by 90 degrees (relative to design element 254) and connected to port instance 260. Cell layout 252 is, for example, constructed utilizing first fabrication process 126, figure 1. Port instance 256 is located at a position X1, Y1 within cell layout 252. Port instance 260 is located at a position X2 Y1 within cell layout 252. Design element 258 has a width W1 and a height H1, as shown.

FIG. 4 further illustrates cell layout 272 that represents cell layout 252 after symmetrical scaling by a scale factor of 0.5. Accordingly, design element 274 represents design element 254 scaled by a factor of 0.5; design element 278 represents design element 258 scaled by a factor of 0.5; design element 274 connects to port instance 276, which represents port instance 256; design element 278 connects to port instance 280, which represent port instance 260; port instance 276 is located at a position X4, Y2 within cell layout 272; and port instance 280 is located at position X3, Y2, within cell layout 272. Design element 278 has a width W2 and a height H2. With the 0.5 scaling factor: X3=X1*0.5; X4=X2*0.5; Y2=Y1*0.5; W2=W1*0.5; and H2=H1*0.5. However, if second design rules 132 do not allow for transistor rotation, for example, the orientation of design element 278 is not permitted in second layout 124.

FIG. 4 thus illustrates cell layout 282, which represents cell layout 252 after asymmetric scaling. Design element 284 represents design element 254 scaled by a factor of 0.5 (i.e., design element 284 is identical in size to design element 274). Design element 288 represents design element 258 scaled by a factor of 0.5 and rotated by −90 degrees, relative to its orientation in cell layout 252. Design element 288 is identical in size to design element 278.

However, to facilitate layout of cell layout 282 (to reorient transistors according to design rules, e.g., to second design rules 132, FIG. 1), connections (e.g., port instances 286 and 290) within cell layout 282 are asymmetrically scaled by factors 0.625 in the x-dimension, and 0.5 in the y-dimension, in this example. More particularly, while design elements 284 and 288 are symmetrically scaled by a factor of 0.5, port instance 286, representing port instance 256, is located at a position X6, Y3 relative to cell layout 282, where X6=X2*0.625, and Y3=Y1*0.5. Port instance 290, representing port instance 260, is located at a position X5, Y3 relative to cell layout 282, where X5=X1*0.625. Accordingly, even though design element 288 is rotated, as compared to design element 258, locations of port instances 286 and 290 are positioned by asymmetric scaling of port instances 256 and 260, so that their relative position within layout 282 (relative to cell layout 252) is the same. In a similar manner, higher level connectivity layers (e.g., metal 1–4 layers, FIGS. 6–10) are also scaled by the same asymmetric scale factor to maintain connectivity within second layout 124.

Figure 5:
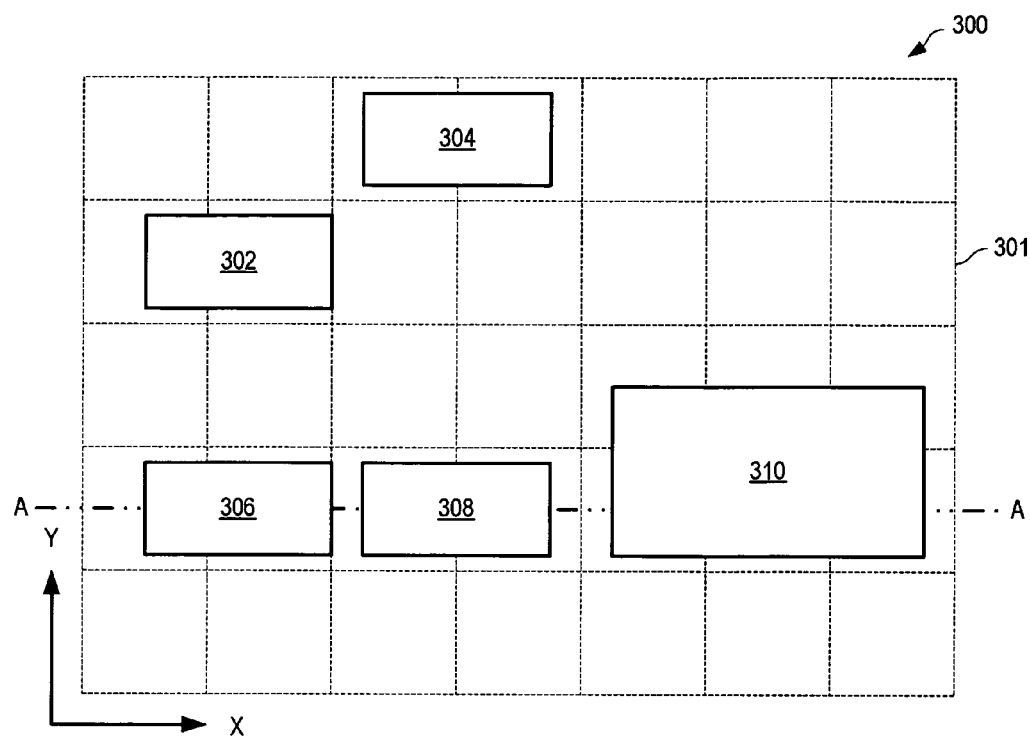
FIG. 5 illustrates one exemplary poly layer of one circuit design.
Figure 6:
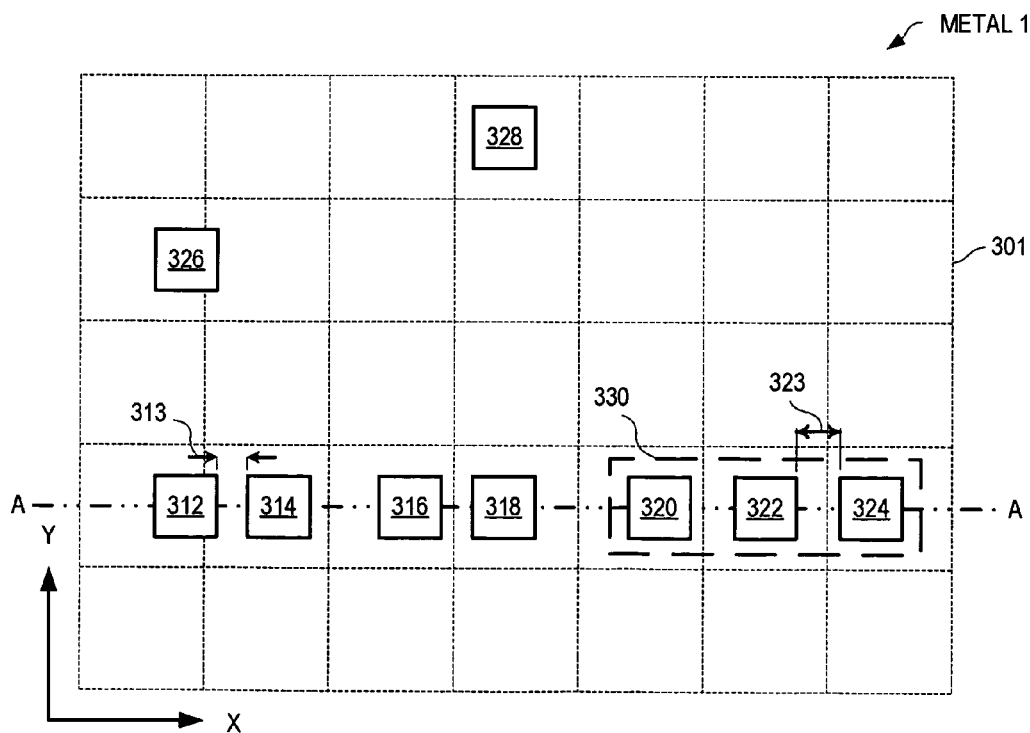
FIG. 6 illustrates one exemplary metal 1 layer that provides connectivity to components of the poly layer of FIG. 5.

In the following example, FIGS. 5–10 show a poly layer 300, a metal 1 layer, a metal 2 layer, a metal 3 layer, a metal 4 layer of an exemplary second circuit design 122. In figure 5, poly layer 300 is shown with an exemplary layout grid 301 associated with an exemplary second fabrication process 128. Poly layer 300 is also shown with five exemplary design elements 302, 304, 306, 308 and 310, representing components (e.g., capacitors, resistors, transistors, etc.) of the exemplary second circuit design. Design element 310, in this example, is a high power component utilizing a via array 330, figure 6, which connects to a power trace 358, FIG. 9. FIG. 6 is also shown with grid 301; it further shows connections to poly layer 300, FIG. 5. Specifically, metal 1 layer includes contacts 312 and 314 that connect to design element 306, contacts 316 and 318 that connect to design element 308, contacts 320, 322 and 324 of a via array 330 that connect power to design element 310, and contacts 326 and 328 that connect to design elements 302 and 304, respectively.

Figure 7:
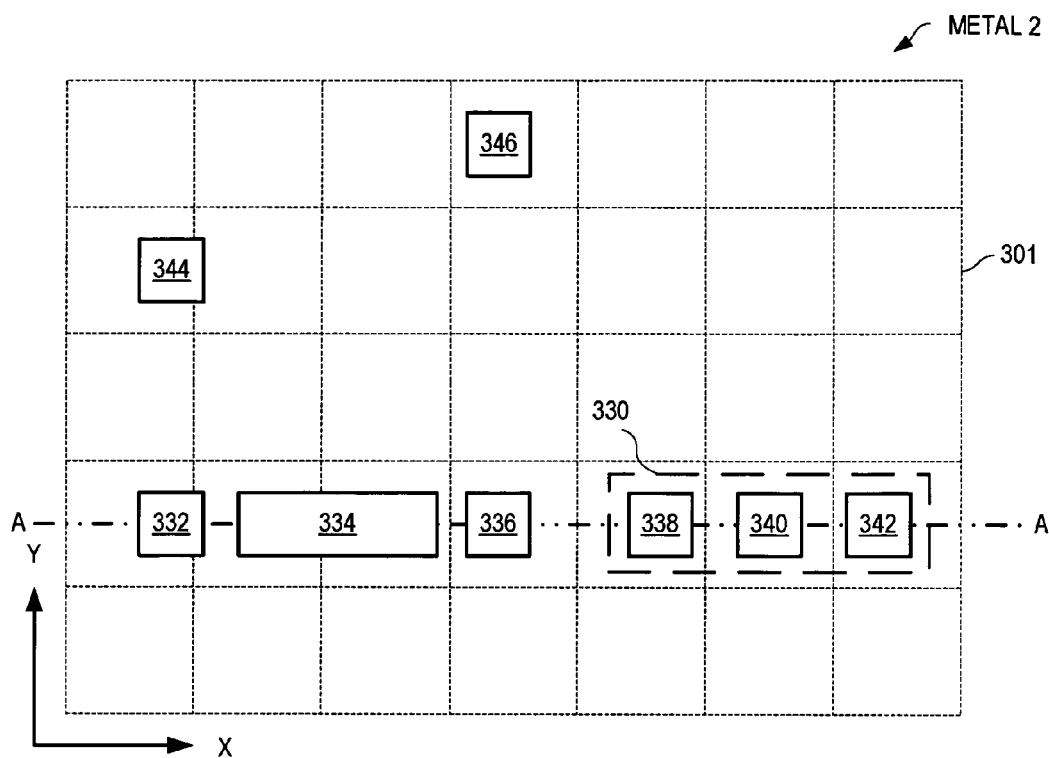
FIG. 7 illustrates one exemplary metal 2 layer that provides y-dimensional connectivity to the poly layer of FIG. 5.

FIG. 7 shows further connections to metal 1 of FIG. 6: A contact 332 connects to contact 312 of metal 1. A trace 334 connects to contacts 314 and 316 of metal 1, thereby connecting design element 306 to design element 308 in FIG. 5 (see also FIG. 10). A contact 336 connects to contact 318 of metal 1. Contacts 338, 340 and 342 are part of via array 330 and connect to contacts 320, 322 and 324 of metal 1. Contacts 344 and 346 connect to contacts 326 and 328, respectively, of metal 1.

Figure 8:
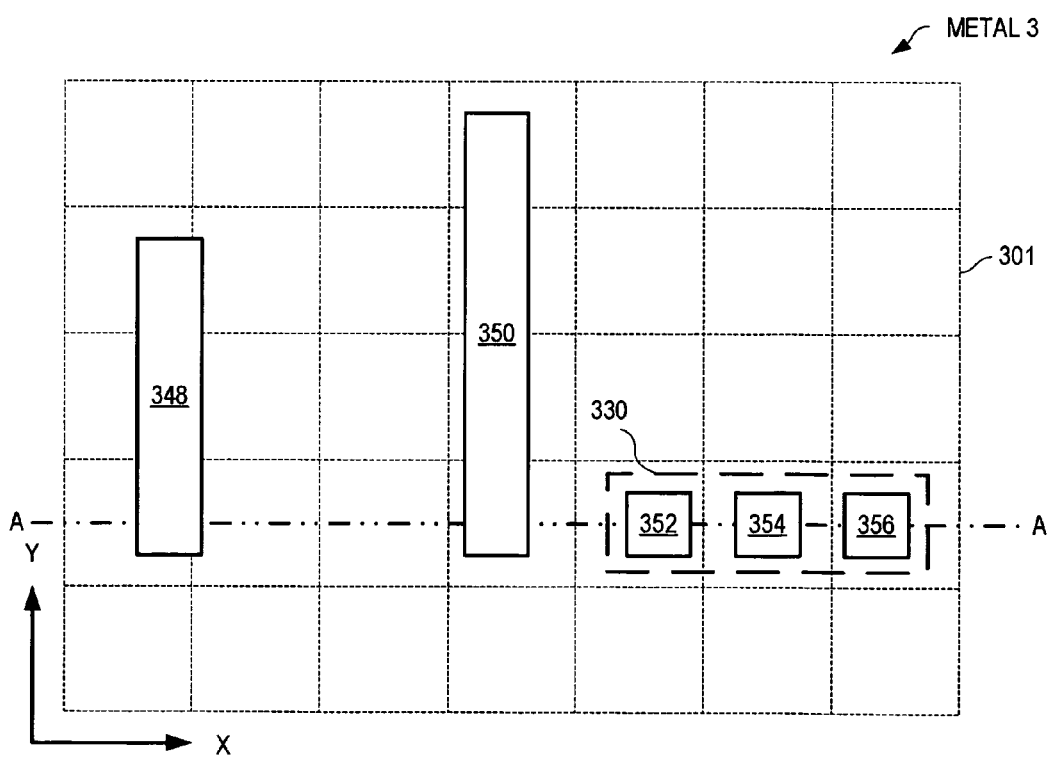
FIG. 8 illustrates one exemplary metal 3 layer that provides x-dimensional connectivity to the poly layer of FIG. 5.

FIG. 8 shows traces 348 and 350 of metal 3, and another part of via array 330. Trace 348 connects to contacts 332 and 344 of metal 2, and, thereby, connects design element 302 to design element 306 of poly layer 300, FIG. 5. Trace 350 connects to contacts 336 and 346 of metal 2, thereby connecting design element 304 to design element 308 of poly layer 300. Contacts 352, 354 and 356 also form part of via array 330 and connect to contacts 338, 340 and 342 of metal 2, respectively.

Figure 9:
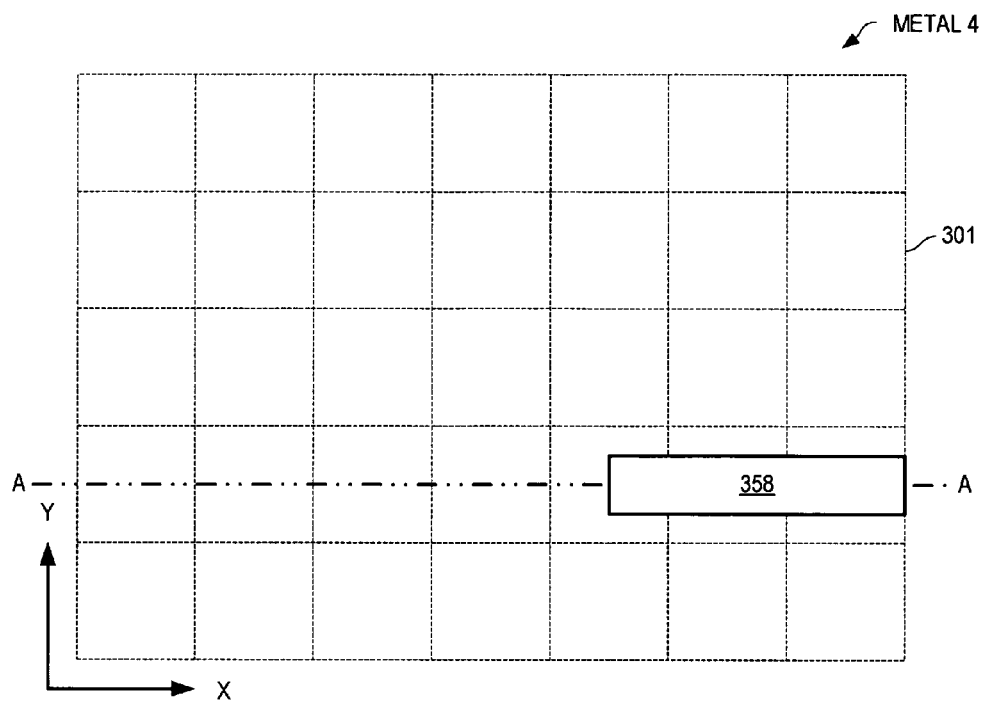
FIG. 9 illustrates one exemplary metal 4 layer that provides power connectivity to the poly layer of FIG. 5.

FIG. 9 illustrates power trace 358, connecting to via array 330, in metal 4 layer. Power trace 358 thus connects to contacts 352, 354 and 356 of metal 3, to connect power to design element 310 of poly layer 300.

In the example of FIGS. 5–9, traces 348 and 350 of metal 3 provide critical clock signal connections in the y-dimension, and metal 2 provides less-critical data signal connections in the x-dimension.

Figure 10:
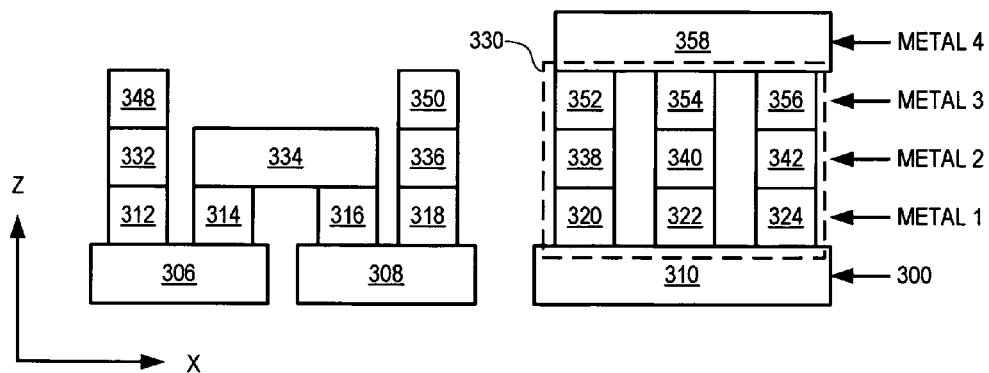
FIG. 10 shows a cross-sectional view of poly layer, metal 1, metal 2, metal 3 and metal 4 of FIGS. 5, 6, 7, 8 and 9, and illustrates exemplary power connectivity using a via array.

FIG. 10 shows a cross-sectional view 'A' as referenced in FIGS. 5–9, and illustrates connections between poly layer 300, metal 1, metal 2, metal 3 and metal 4. In particular, FIG. 10 shows design element 306 connected to contact 314, which connects to trace 334, to contacts 316, and to design element 308, as shown. FIG. 10 also illustrates via array 330, including contacts 320, 322, 324, 338, 340, 342, 352, 354 and 356 used to connect power trace 358 to design element 310. The forgoing examples will now be used to illustrate the following description.

Figure 11:
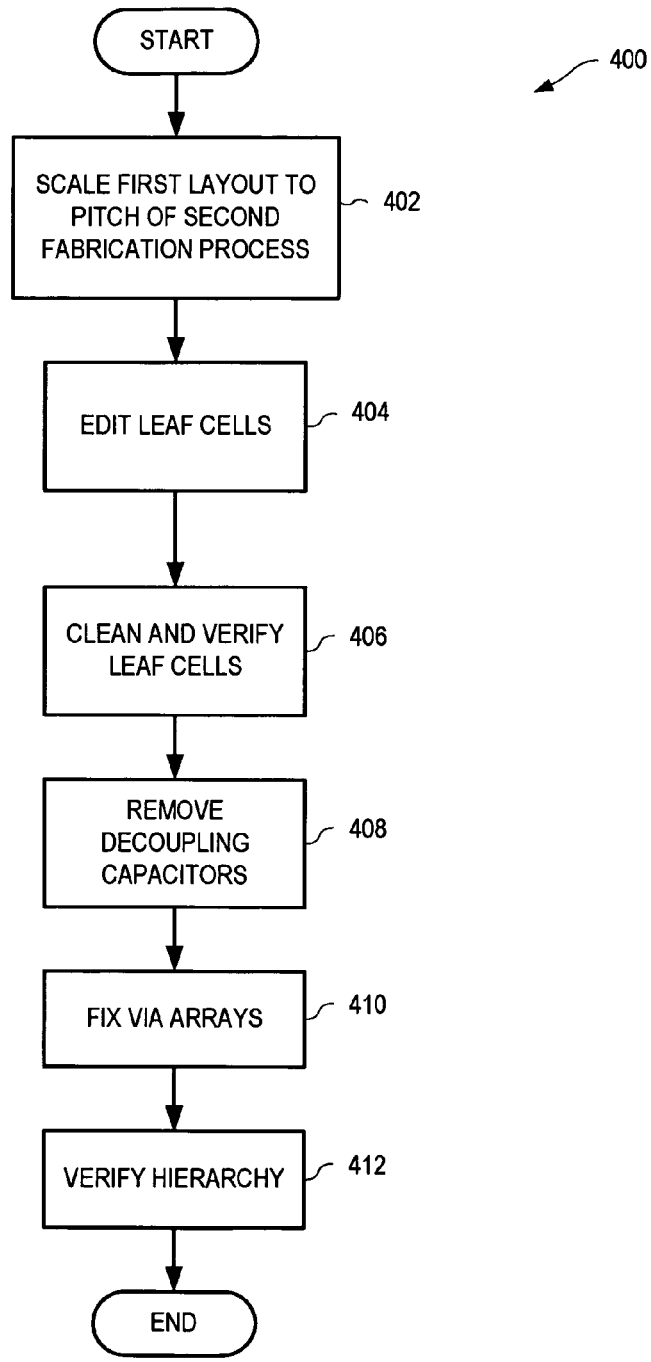
FIG. 11 is a flowchart illustrating one process for asymmetrically shrinking a VLSI circuit design layout.
Figure 12:
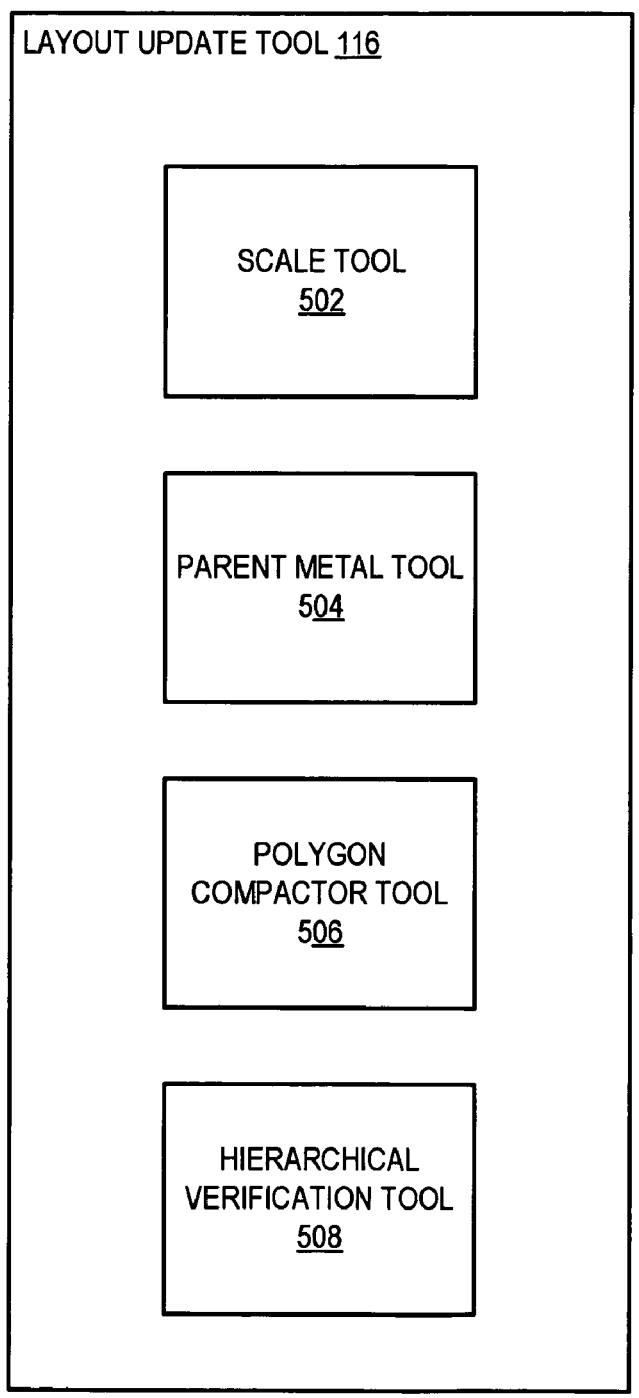
FIG. 12 shows exemplary tools suitable for use with the process of FIG. 11.

In particular, FIG. 11 is a flowchart illustrating one process 400 to asymmetrically shrink a first layout (e.g., first layout 120, FIG. 1) to a second layout (e.g., second layout 124, FIG. 1). FIG. 12 is a block diagram illustrating exemplary tools of layout update tool 116 as used by process 400. FIG. 11 and FIG. 12 are referenced together in the following description. Specifically, process 400 may be an automated process, or may involve interaction with one or more design engineers (e.g., through user interface 110, FIG. 1). In one example, process 400 is implemented by processor 108, E-CAD software 114 and layout update tool 116 when processing first circuit design 118 to generate second circuit design 122. In step 402, a scale tool 502, FIG. 12, is used to scale first layout 120 to a pitch associated with second fabrication process 128. For example, if first fabrication process 126 has an associated pitch of 8 μm and second fabrication process 128 has an associated pitch of 4 μm, scale tool 502 scales first layout 120 by a factor of 0.5 in both x and y directions, in step 402. However, if symmetrical rescaling of first layout 120 does not allow for new constraints and design rules (e.g., second design rules 132, FIG. 1) introduced by second fabrication process 128, asymmetrical scaling factors for x and y-dimensions are made in step 402, for example to accommodate transistor rotation limitations in the x-dimension. In one example, the x-dimension is scaled, in step 402, by a factor of 0.625, and the y-dimension is scaled by a factor of 0.5.

In step 404, instances of leaf cells (e.g., instances D1, D2, E1 and E2, FIG. 3) are edited to conform to second design rules 132. In one example, if second design rules 132 prohibit rotation of transistors, any rotated transistors in second layout 124 are corrected in step 404. In another example of step 404, node area check ("NAC") diodes (e.g., diodes added during layout of first layout 120 to protect poly layer design elements against electrostatic discharge damage during manufacture, for example) are removed as second fabrication process 128 may require alternate placement of NAC diodes in second layout 124.

In one embodiment, during modification of second layout 124, in step 404, port instance locations are maintained relative to their original scaled locations, such as shown and described in connection with FIG. 4. Accessibility to the port instances may also be maintained to avoid collisions with metal layers (e.g., metal 1, metal 2, metal 3 and metal 4, FIGS. 6–9) in circuit design hierarchy. A parent metal tool 504, FIG. 12, is therefore used to map connections (e.g., connections 312–328 of FIG. 6) between poly layer 300 and metal 1, to maintain connectivity and port instance location during editing of second layout 124, in step 404.

In step 406, a polygon compactor tool 506, FIG. 12, is used to correct design rule violations resulting from asymmetrical shrinking of first layout 120. In one example of step 406, positioning of connections (e.g., connections 312–328 of FIG. 6) between poly layer 300 and metal 1 are spaced apart according to second design rules 132. In one embodiment, polygon compactor tool 506 is programmed with one or more design rules of second design rules 132 and is operable to 'clean up' one or more layers (e.g., poly layer 300, metal 1, metal 2, etc.) of second layout 124. Polygon compactor tool 506 may also correct contact spacing (e.g., ensuring spacing 313 between contacts 312 and 314, FIG. 6, is not less than a minimum definition within second design rules 132) and other parameters of poly layer 300, for example, thereby removing the need for tedious manual correction.

In step 408, additional modifications to second circuit design 122 are made; step 408 may be interactive with one or more design engineers. For example, due to leakage current, one o, more decoupling capacitors (e.g., design element 302, FIG. 5) may be removed from second circuit design 122, and hence, second layout 124, in step 408. These decoupling capacitors may be replaced by custom fill cells, in step 408, thereby removing the need for further modification of surrounding cells in second layout 124.

In step 410, design rule check ("DRC") errors identifying errors in spacing of via arrays at the functional unit block ("FUB") level are corrected by polygon compactor tool 506, FIG. 12. For example, a DRC error identifying an error in spacing 323 between contacts 322 and 324 of via array 330, FIGS. 6–8 and 10, may be corrected in step 410. In particular, step 410 may correct errors associated with power rail (e.g., power trace 358, FIG. 9) vias of second circuit design 122 that utilize metal 3 and metal 4 layers.

In step 412, part or all of circuit design hierarchy is verified against second design rules 132 by a hierarchical verification tool 508, FIG. 12. For example, in step 412, hierarchical verification tool 508 recursively runs one or more design rule checking tools on one or more cells or FUBs of interest; this removes the need to manually verify each cell. For example, cells A–E, FIG. 2, may be checked by hierarchical verification tool 508 to identify hierarchical errors in second circuit design 122, in step 412. In one embodiment of step 412, hierarchical verification tool 508 generates a report for each checked cell allowing the design engineer to quickly assess areas that need attention after shrinking process 400.

Figure 13:
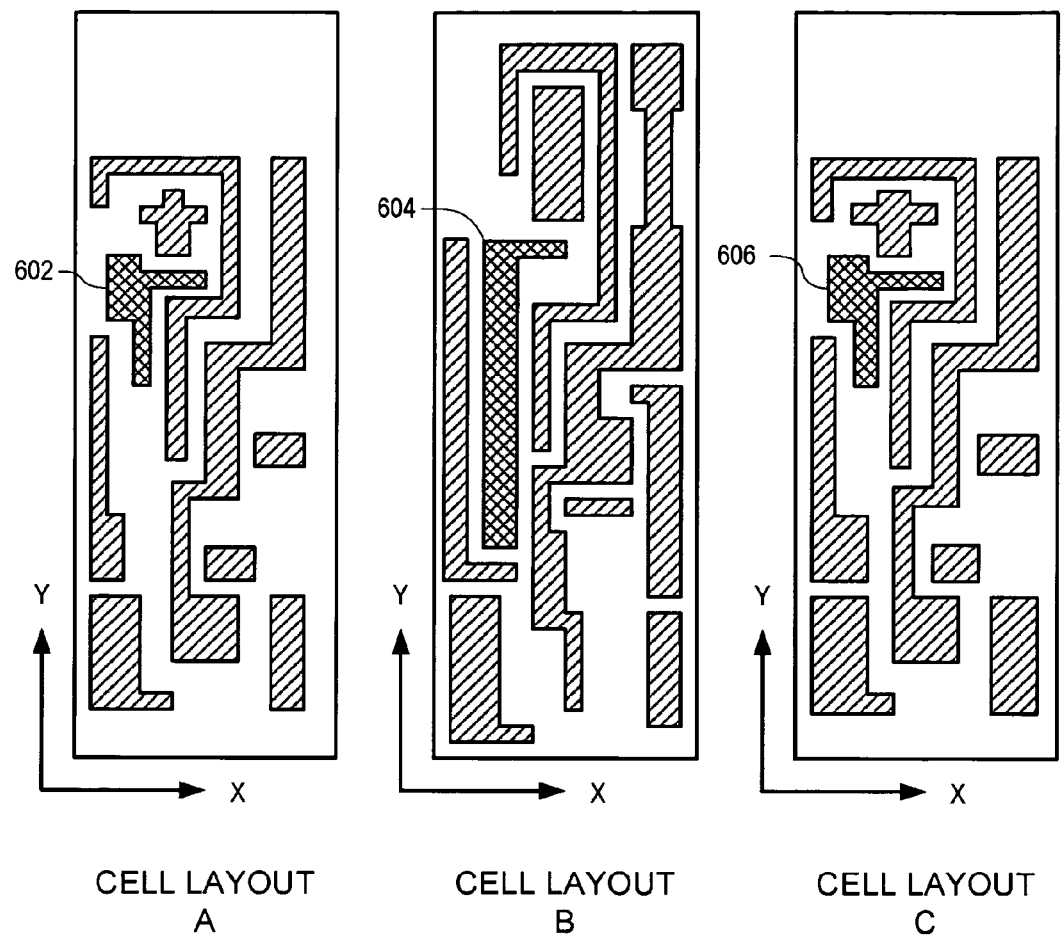
FIG. 13 illustrates three exemplary layouts of one cell showing metal 1 and metal 2 connectivity.

To show the relevance of port instance location before and after asymmetrical scaling, FIG. 13 illustrates exemplary layouts (cell layout A, cell layout C) showing metal 1 and metal 2 layer connectivity for one leaf cell during an exemplary generation of circuit design 122, and a manual layout (cell layout B) generated by manual scaling. Cell layout A thus represents one layout of the leaf cell after symmetric scaling of an original layout (e.g., a leaf cell within first layout 120, prior to modification by shrink process 400). Cross-hatched area 602 represents a port instance of the leaf cell that provides connectivity to components therein. Cell layout B for example represents a layout of the leaf cell when manually conformed to second design rules 132 of second fabrication process 128. A port instance 604 represents port instance 602 of cell layout A. As illustrated, the location of port instance 604 has changed as compared to port instance 602; therefore, an assembly script, used to assemble layers of cell layout B, must be re-created to ensure correct connectivity between layers. Cell layout C represents a layout of the leaf cell after processing of cell layout A by process 400, FIG. 11. A port instance 606 represents port instance 602 of cell layout A. As illustrated, port instance 606 is located in the same relative location as port instance 602, thereby avoiding manual steps to ensure conformity. Minor differences may occur due to changes required by second design rules 132. Hence, with port instance 606 located in the same location as port instance 602, assembly scripts of first circuit design 118 may be used to assemble cell layout C.

Figure 14:
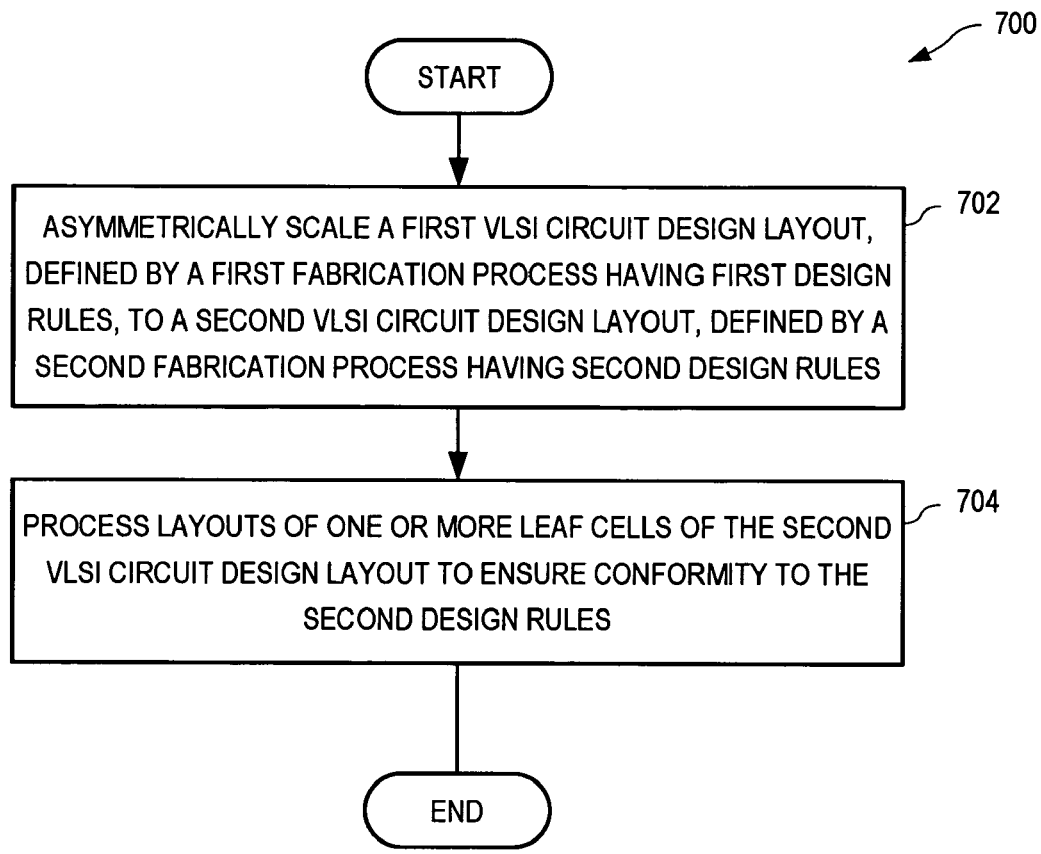
FIG. 14 is a flowchart illustrating one process for asymmetrically shrinking a VLSI circuit design layout.

FIG. 14 is a flow chart illustrating one process 700 for asymmetrically shrinking a VLSI circuit design layout. In one example, process 700 is implemented by processor 108, E-CAD software 114 and layout update tool 116 when processing first circuit design 118 to generate second circuit design 122. In step 702, a first VLSI circuit design layout (e.g., first layout 120), defined by a first fabrication process (e.g., first fabrication process 126) with first design rules (e.g. first design rules 130), is asymmetrically scaled to a second VLSI circuit design layout (e.g., second layout 124), defined by a second fabrication process (e.g., second fabrication process 128) with second design rules (e.g., second design rules 132). In step 704, layouts of one or more leaf cells (e.g., cell instances D1, D2, E1 and E2, FIG. 3) of the second VLSI circuit design layout are processed to ensure conformity to the second design rules (e.g., second design rules 132). Optionally, one or more leaf cells (e.g., leaf cells D and E, FIG. 2) are modified to incorporate design changes relating to the conversion from the first fabrication process to the second fabrication process. Processing, in step 704, may also include cleaning and verifying the leaf cells to conform to the second design rules.

Upon reading and fully understanding this disclosure, one of ordinary skill in the art appreciates that engineering may be enhanced (and time may be saved) by following the process described above when converting a VLSI circuit design from one fabrication process to a second. Even when the circuit design itself changes, large areas within the design remain unchanged and may be quickly converted to conform to the new fabrication process requirements. Further, by understanding this methodology during initial VLSI circuit design, design changes may facilitate the changes from one fabrication process to another when using the described methodology.

By utilizing the hierarchical nature of a circuit design, efficiency in the conversion from a first circuit design layout (using a first fabrication process) to a second circuit design layout (using a second fabrication process) may be achieved. Engineering effort associated with the first layout may be reused for the second layout, saving valuable resources. VLSI circuit design projects may therefore incorporate fabrication process improvements while maintaining a small engineering team, reducing costs even if transistor re-engineering is required.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A process for asymmetrically shrinking a layout for a VLSI circuit design, comprising:
    asymmetrically scaling a first VLSI circuit design layout defined by a first fabrication process, having first design rules, to a second VLSI circuit design layout defined by a second fabrication process, having second design rules, wherein the asymmetrically scaling comprises simultaneously applying different x-dimension and y-dimension scaling factors; and processing layouts of one or more leaf cells of the second VLSI circuit design layout to ensure conformity to the second design rules.

2. The process of claim 1, the step of asymmetrical scaling further comprising reorienting one or more transistors in accord with the second design rules.

3. The process of claim 1, the step of asymmetrically scaling further comprising maintaining one or more port instance locations within the second VLSI circuit design layout relative to the first VLSI circuit design layout.

4. The process of claim 1, the step of processing further comprising processing via arrays of the second VLSI circuit design layout to conform to the second design rules.

5. The process of claim 1, the step of processing further comprising verifying hierarchy associated with the second VLSI circuit design layout.

6. The process of claim 1, the step of asymmetrically scaling further comprising symmetrically scaling design elements of the first VLSI circuit design layout according to the second design rules.

7. The process of claim 1, further comprising maintaining locations of port instances relative to the asymmetric scaling between the first VLSI circuit design layout and the second VLSI circuit design layout.

8. A software product comprising instructions, stored on computer-readable media, wherein the instructions, when executed by a computer, perform steps for asymmetrically shrinking a layout for a VLSI circuit design, comprising:
    instructions for asymmetrically scaling a first VLSI circuit design layout, defined by a first fabrication process having first design rules, to a second VLSI circuit design layout, defined by a second fabrication process having second design rules, wherein the instructions for asymmetrically scaling comprise instructions for simultaneously applying different x-dimension and y-dimension scaling factors; and
    instructions for processing layouts of one or more leaf cells of the second VLSI circuit design layout to ensure conformity to the second design rules.

9. The software product of claim 8, the instructions for asymmetrical scaling further comprising instructions for reorienting one or more transistors in accord with the second design rules.

10. The software product of claim 8, the instructions for asymmetrical scaling further comprising instructions for maintaining one or more port instance locations within the second VLSI circuit design layout relative to the first VLSI circuit design layout.

11. The software product of claim 8, the instructions for processing further comprising instructions for processing via arrays of the second VLSI circuit design layout to conform to the second design rules.

12. The software product of claim 8, the instructions for processing further comprising instructions for verifying hierarchy associated with the second VLSI circuit design layout.

13. The software product of claim 8, the instructions for asymmetrically scaling further comprising instructions for symmetrically scaling design elements of the first VLSI circuit design layout according to the second design rules.

14. The software product of claim 8, further comprising instructions for maintaining locations of port instances relative to the asymmetric scaling between the first VLSI circuit design layout and the second VLSI circuit design layout.

15. A system for asymmetrically shrinking a layout for a VLSI circuit design, comprising:
    means for asymmetrically scaling a first VLSI circuit design layout, defined by a first fabrication process having first design rules, to a second VLSI circuit design layout, defined by a second fabrication process having second design rules, wherein the means for asymmetrically scaling comprises means for simultaneously applying different x-dimension and y-dimension scaling factors; and
    means for processing layouts of one or more leaf cells of the second VLSI circuit design layout to ensure conformity to the second design rules.

16. The system of claim 15, the means for asymmetrically scaling comprising a layout update tool.

17. The system of claim 15, the means for asymmetrically scaling comprising means for maintaining one or more port instance locations within the second VLSI circuit design layout relative to the first VLSI circuit design layout.

18. The system of claim 15, the means for processing comprising means for verifying hierarchy associated with the second VLSI circuit design layout.

* * * * *